United States Patent [19]

Christatos

[11] Patent Number: 4,502,609

[45] Date of Patent: Mar. 5, 1985

[54] SLIDING AND PIVOTED CLOSURE FOR A LOCK BOX

[76] Inventor: Jerry P. Christatos, 344 Slocum Way, Fort Lee, N.J. 07024

[21] Appl. No.: 589,896

[22] Filed: Mar. 15, 1984

[51] Int. Cl.³ ............................................. B65D 43/06
[52] U.S. Cl. .................................. 220/329; 220/331; 220/3.8; 220/345
[58] Field of Search ................. 220/3.8, 331, 329, 335, 220/345, 210; 174/66, 67, 52 R

[56] References Cited

U.S. PATENT DOCUMENTS

| | | | |
|---|---|---|---|
| 2,804,986 | 9/1957 | Jeffers et al. | 220/3.8 |
| 3,315,023 | 4/1967 | Davis | 220/3.8 |
| 3,945,530 | 3/1976 | Bozich | 220/329 |
| 3,955,709 | 5/1976 | Coley et al. | 220/335 |
| 4,122,972 | 10/1978 | Bozich | 220/331 |
| 4,129,743 | 12/1978 | Lohsh | 220/3.8 |
| 4,365,723 | 12/1982 | Palermo et al. | 220/3.8 |

Primary Examiner—George T. Hall
Attorney, Agent, or Firm—Gottlieb, Rackman & Reisman

[57] ABSTRACT

An improved electrical lock box having particular application for mounting cable television distribution units. The lock box comprises an open faced housing having opposing side flanges which extend inwardly, and a cover having an inwardly extending top end flange. The cover also includes horizontally aligned slots in its top end which slidably and pivotally engage the housing side flanges to position the cover in overlying relation with respect to the open housing face. Safety locking indentations are provided in the housing side flanges which automatically engage the cover slots when the cover is moved downward, preventing inadvertent movement and dislodgement of the cover. The cover slots and indentations are dimensioned such the cover disengages the indentations when the cover pivoted about the horizontal access defined by the slots.

12 Claims, 11 Drawing Figures

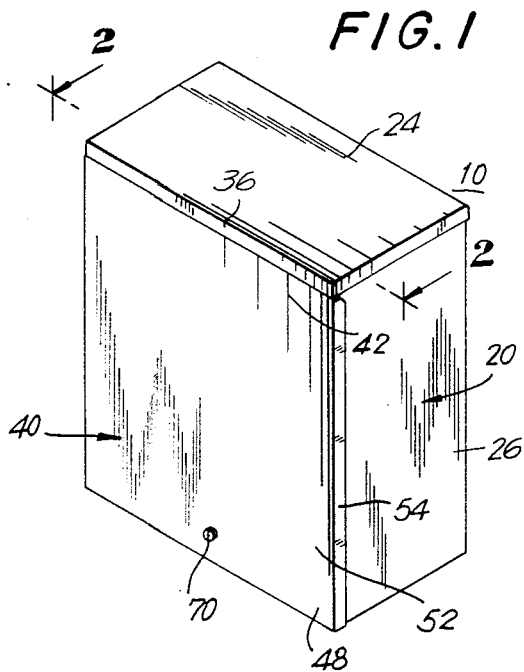
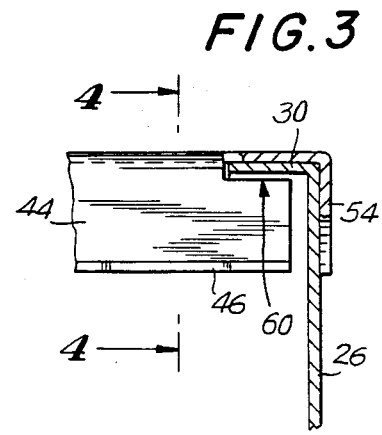
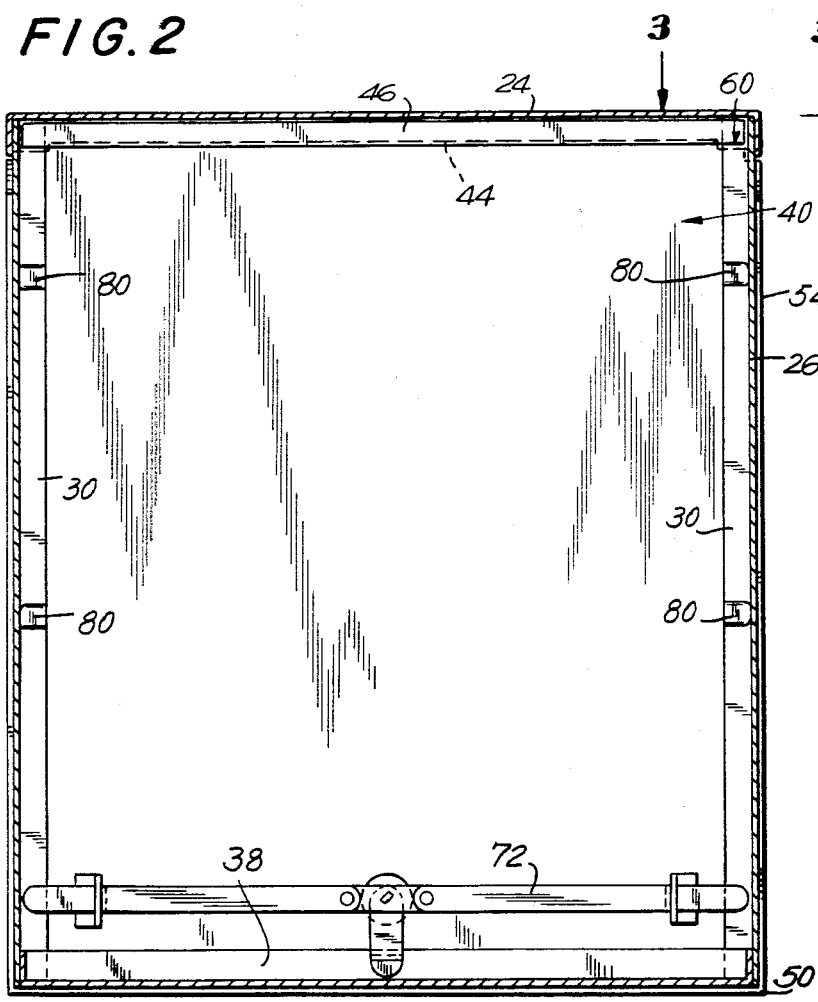
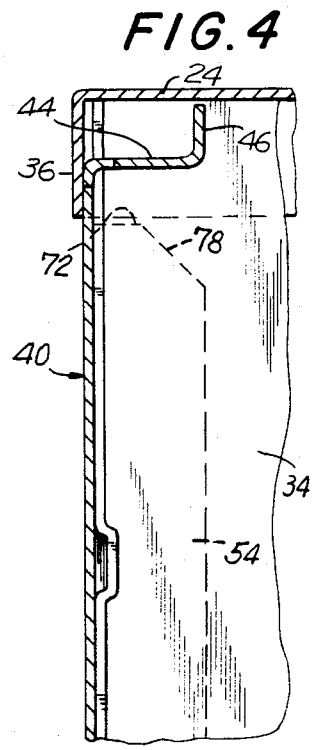

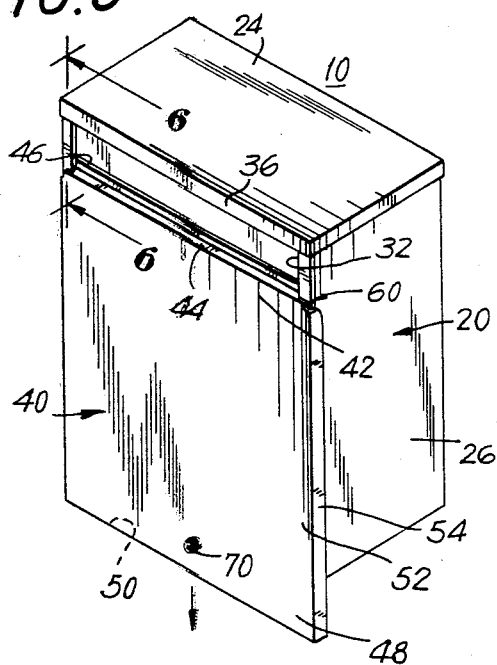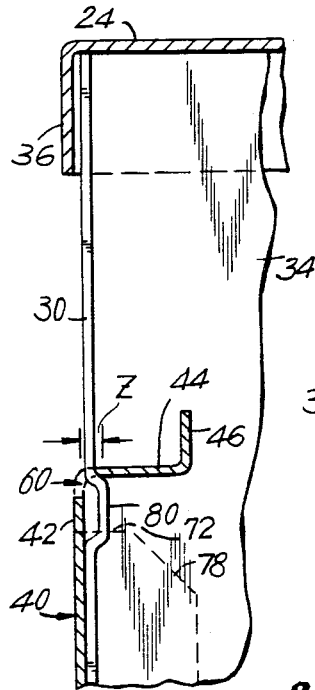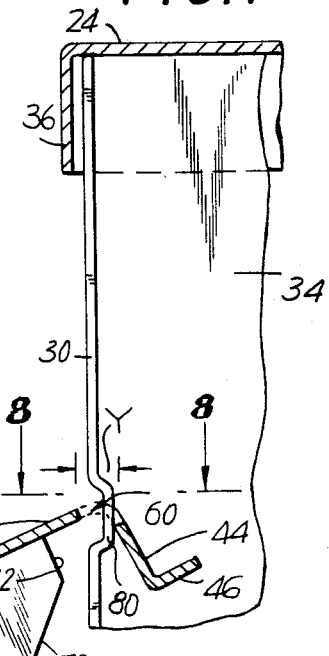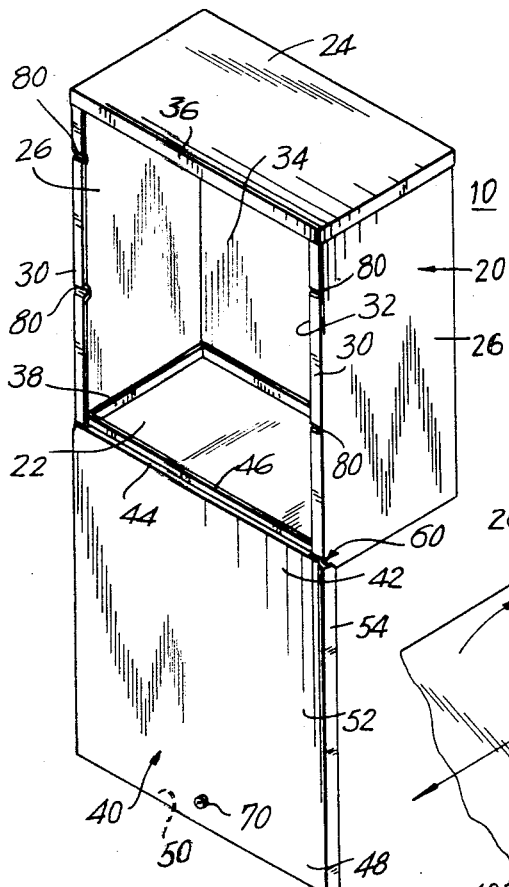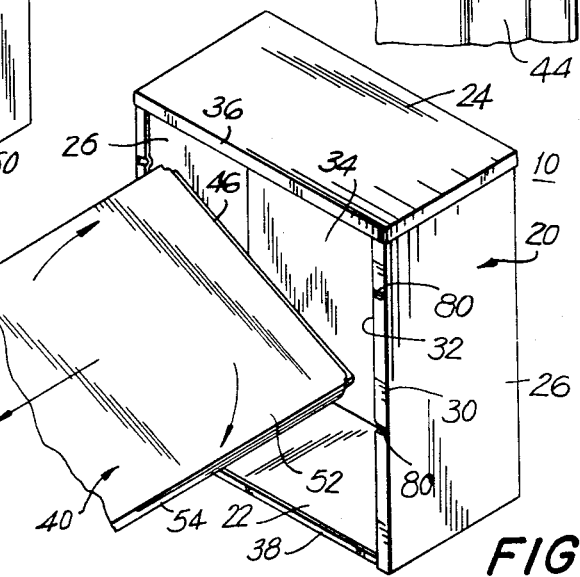

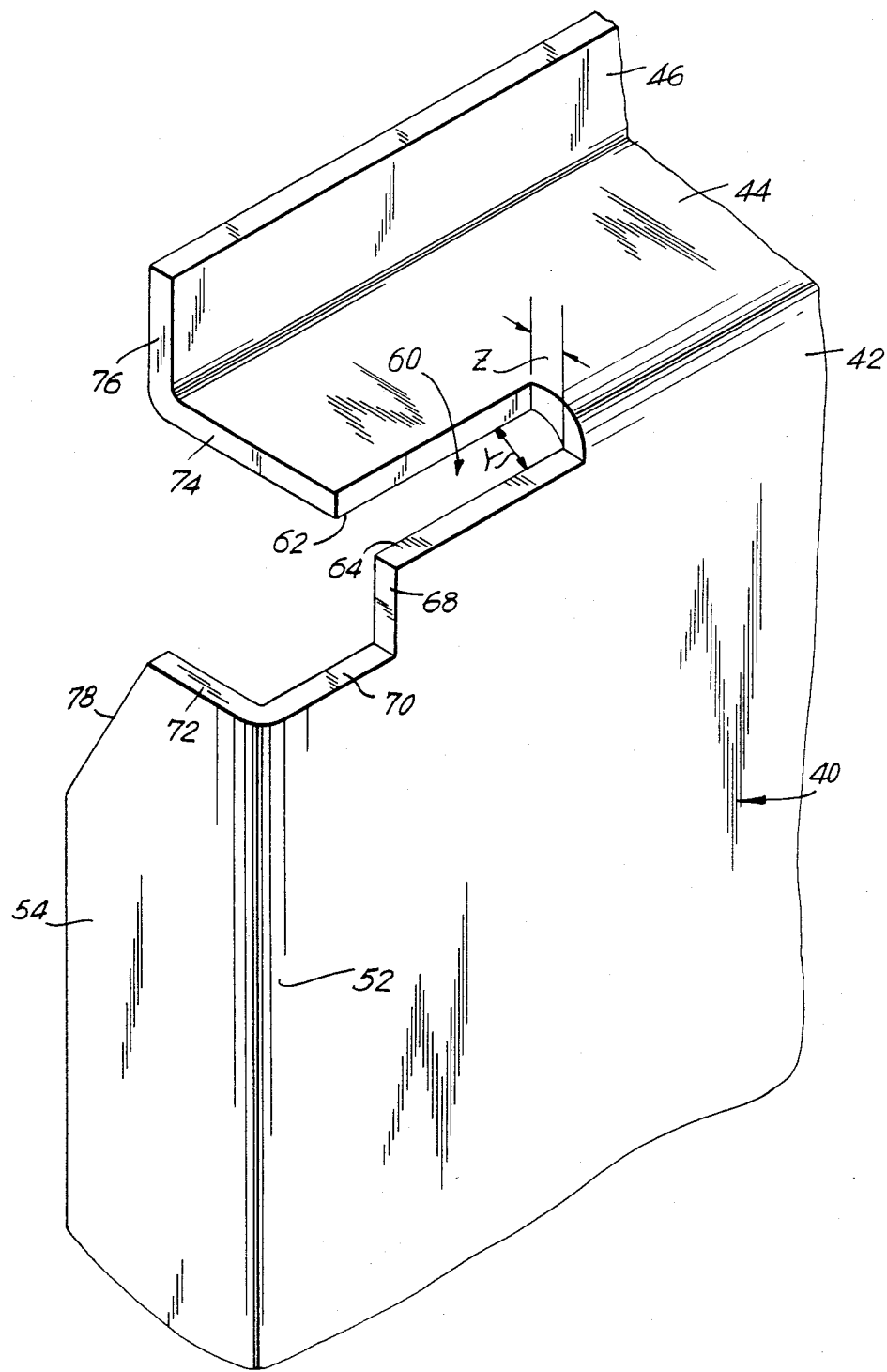

SLIDING AND PIVOTED CLOSURE FOR A LOCK BOX

DESCRIPTION

1. Technical Field

This invention relates generally to electrical mounting boxes and, more particularly, to "lock boxes" of the type having application for housing cable television distribution units.

2. Background Art

In the cable television business, it is customary to provide a lock box for multi-dwelling buildings, such that the main system cable typically comes into the box at one point and leaves the box at another point. Inside the box there are many different distribution units (taps, or splitters).

For reasons of safety and to avoid unauthorized access to cable distribution units, such lock boxes are generally constructed from a heavy and rigid metal and provided with a weatherproof interior chamber for electrical components. Additionally, lock boxes are designed with a view towards facilitating ready access for servicing, replacement and disconnect of individual cable units.

Difficulties in providing lock boxes which satisfy these industry requirements are presented by the heavy weight of lock box covers which are difficult to maneuver and remove from the box housing, and the industry practice of locating such boxes at elevated locations. For example, lock boxes may be located within a multi-dwelling building mounted at an elevated location on a wall. When a heavy weight cover is unlocked, there is the danger that the cover will dislodge from the box, causing injury to the cable television serviceman or other person.

In one standard prior art approach, lock boxes are provided with a swinging cover hinged along a vertical edge. Although this construction prevents inadvertent dislodgment danger is presented to the serviceman. Typically, the serviceman gains access to the box on a ladder, when swinging the cover open the serviceman may be required to lean backwards causing a loss of footing on the ladder and resultant injury.

Another prior art lock box utilizes a cover which is slidably attached to the box housing with the cover being secured in a closed position by a conventional lock. The problem with this general approach, when used in cable television applications, is that the cover is very heavy, and caution must be exercised to prevent the cover from sliding open without restraint, hitting the serviceman on the head or other part of his body. Lock boxes of this type are represented by U.S. Pat. No. 2,804,986 to Jeffers.

In another approach of the prior art, represented by U.S. Pat. No. 4,365,723 to Palermo, a lock box is provided which includes a cover having an arrangement of flanges which engage corresponding flanges in the box housing, permitting removal of the cover by a pivoting motion. Again, the heavy weight of the cover presents a danger that it will either cause injury to the serviceman or dislodge from the box.

Accordingly, it is a broad object of the present invention to provide an improved lock box cover particularly suitable for application in the television industry.

Another object of the present invention is to provide an improved lock box including a safety cover locking feature which prevents inadvertent opening and dislodgement of the cover from the lock box housing.

Yet another object of the present invention is to provide an improved safety lock box which is weatherproof and has a cover structure which permits ready access to housed electrical components.

DISCLOSURE OF THE INVENTION

In the present invention, these purposes, as well as others which will be apparent, are achieved generally by providing a lock box including an open-faced housing having generally opposed inwardly extending side flanges, and a cover having an inwardly extending top end flange. Opposing slots are positioned in the top side ends of the cover for slidable and pivotal engagement with the side housing flanges, so that the cover may be positioned in overlying relation with respect to the open face of the housing. A safety locking means, including at least one indentation in a housing side flange, restrains downward movement of the cover with respect to the housing, automatically engaging the slots when the cover is oriented in a generally parallel relation to the side housing flanges and caused to move downward from a closed position. Disengagement of the locking mechanism is effected by pivoting the cover about the horizontal axis defined by the cover slots.

According to a preferred embodiment of the invention, the housing side flanges include two pairs of spaced indentations, each pair including indentations in opposing housing side flanges which are aligned in a common horizontal plane. In this preferred embodiment, the depth of the indentations is greater than the horizontal, but less than the angular distance between side edges which define the cover slots. By reason of these prescribed dimensions for the indentations and cover slots, disengagement of the safety locking means is obtained when the cover is pivoted to an angular orientation with respect to the housing side flanges of approximately 45 degrees.

Other objects, features and advantages of the present invention will be apparent when the detailed description of the preferred embodiment of the invention is considered in conjunction with the drawings, which should be construed in an illustrative and not limiting sense, as follows:

BRIEF DESCRIPTION OF THE DRAWINGS

FIG. 1 is a perspective view of the outside of a lock box according to the present invention;

FIG. 2 is a sectional view, taken along the line 2—2 of FIG. 1, showing the rear side of the box cover and housing side flanges, including inwardly extending cover flange slots and safety locking indentations;

FIG. 3 is a sectional view taken along the line 3—3 of FIG. 2;

FIG. 4 is a sectional view taken along the of 4—4 of FIG. 3;

FIG. 5 is a perspective view of the outside of the lock box, similar to that of FIG. 1, showing the manner in which the cover is secured to the box for upward and downward movement;

FIG. 6 is a sectional view taken along the line 6—6 of FIG. 5;

FIG. 7 is a sectional view similar to that of FIG. 6, showing the manner in which the cover is pivoted for disengagement with the safety locking indentations;

FIG. 8 is a sectional view taken along the line 8—8 of FIG. 7;

FIG. 9 is a perspective view of the lock box similar to that of FIG. 5, showing the cover in an open position providing full access to the interior of the lock box;

FIG. 10 is a perspective view of the lock box showing the manner in which the cover may be rotated axially to effect its disengagement from the box housing; and FIG. 11 is an exploded fragmentary perspective view of the cover showing the configuration of the cover slots.

BEST MODE FOR CARRYING OUT THE INVENTION

Referring now to the drawings, a lock box according to the present invention is generally designated 10. The lock box 10 may be employed for housing electrical equipment and may advantageously be used for mounting cable television distribution units, taps or "splitters."

Lock box 10 includes a housing 20 having a generally rectangular solid configuration, and a removable cover 40, and is preferably formed of a weather resistent, rigid metal, such as a galvanized steel which may be employed in outdoor applications. Conventional "knockout" panels may be provided in the box housing 20 for entry of cables to the box. Openings may also be provided for receiving fastening bolts to facilitate mounting of the box to a wall or other structure.

The housing 20 includes bottom, top, side and rear walls, respectively designated, 22, 24, 26 and 28 which define an open housing face 32, and an interior chamber 34 for receiving electrical components. The side walls 26 terminate, at the front end of the housing (see FIGS. 9, 10), in inwardly extending side flanges 30 which extend the vertical length of the housing. Top wall 24 preferably terminates in a downwardly extending flange 36 which overlies the top ends of side walls 26, side housing flanges 30 and rear wall 28. In like manner, bottom wall 22 includes an upwardly extending peripheral flange 38 which is received within and encased by side walls 26 and rear wall 28. Conventional fastening arrangements, for example, spot welding, may be employed to secure the housing sections together to provide a rigid enclosure.

As best shown in FIGS. 1 and 5, cover 40 is dimensioned to overlie the open face 32 of the housing in a manner which facilitates access to the enclosed electrical components. The cover 40 includes a top end 42 having an inwardly extending flange 44 and upward flange 46, a bottom end 48 which terminates in inwardly extending flange 50, and side ends 52 which terminates in inwardly extending side flanges 54. The top end and opposing side ends of the cover 42, 52 include horizontally aligned slots 60 which slidably engage the side housing flange sections 30, in a manner to be described in detail below, so that the cover may be selectively positioned in an open and closed position relative to the open face of the housing, see FIGS. 1, 5 and 9.

The cover slots 60, include spaced apart side edges 62, 64 and a base edge 66. Side edges 62 are positioned within the inward extending cover flange 44, and side edges 64 are positioned in the top cover end 42 such that the side edges 62, 64 are in horizontally offset planes separated by an angular distance Y and vertical planes which are separated by a distance Z (see FIG. 12).

The top end of the cover 42, adjacent the cover slots 60, also includes sections of reduced widths, respectively, defined by edges 68, 70 and 72 which extend contiguously from slot edges 64, and edges 74, 76 which extend contiguously from slot edges 62. Edges 68 extend vertically a spaced distance downward from slot edges 64, and edges 70 extend from the base of edges 68 outwardly to edges 72 which in turn define the terminating ends of inwardly extending cover flanges 54. Edges 74, 76 extend contiguously from slot side edges 62 and define the terminating ends of inwardly and upwardly extending cover flanges 50, 46, both edges terminating in alignment with vertical edges 68.

The cover 40 is removably connected to the housing, as shown in FIG. 10, by orienting the cover in a plane which is angularly offset from the top and bottom walls of the cover 22, 24, permitting side edges of the cover 74, 76 to pass between side housing flanges 30. Alignment of the cover slots 60 with the side housing flanges 30 and reorientation of the cover to a position overlying housing 20 effects engagement of the cover with the housing flanges 30. In order to prevent the side cover flanges 54 from obstructing engagement of the cover slots 60 with housing flanges 30, side housing flanges 54 are provided with angular edges 78 which are adjacent cover edges 72. The angular orientation of cover edges 78 defines the minimum angle at which the cover 40 may be rotated for engagement of cover slots 60 and housing side flanges 30 (see FIG. 10). Engagement of slots 60 and housing side flanges 30 is most readily effected when the cover is orientated at approximately a 45 degree angle at which the plane defined by slot edges 62, 64 assumes a generally perpendicular orientation with respect to the plane of side housing flanges 30, such that distance Y between the edges assumes a maximum dimension relative to the thickness of housing flanges 30.

With the engagement of the cover slots 60 and side housing flanges 30, the cover 40 may be slidably positioned from a closed position, shown in FIG. 1, to the open position of FIG. 9 in which unobstructed access may be obtained to the interior housing chamber 34. When the cover 40 is closed, the top cover end 42 is received under the downwardly extending flange 36 of the housing (see FIGS. 6 and 7). To this end, the downwardly extending housing flange 36 is spaced outwardly from the housing side flanges 30. Advantageously, when the cover 40 is closed, the inwardly extending side and bottom cover flanges 54, 50 encase housing side and bottom walls 26, 22 to provide a weather tight enclosure for electrical components (see FIG. 1).

The cover 40 is secured in overlying relation with respect to the open face of the housing 32 by a conventional locking mechanism which serves the dual purpose of securing the cover against downward movement and preventing unauthorized access to housed electrical components. Such a locking system is illustrated in FIG. 2 which shows a key actuated lock 70 which includes a dead bolt 72.

As a further feature of the lock box 10, a safety means is provided for fixing the position of the cover 40 with respect to the open face 32 of the housing. Advantageously, the safety means engages automatically when the cover lock 70 is opened and the cover is allowed to move downward. The safety means, best shown in FIGS. 2, 6 and 7, comprises two pairs of spaced indentations 80 positioned in the inwardly extending side housing flanges 30. The pairs of indentations 80 which include indentations in the opposing side housing flanges 30 positioned in horizontal alignment. The indentations 80 have a depth which is greater than the horizontal distance Z between the planes defined by the side edges of the cover slots 62, 64, but less than the angular distance Y between the slot edges (see FIG. 11).

The indentations 80 automatically engage the cover slots 60, as shown in FIG. 6, when the cover lock 70 is released and the cover is permitted to move downward. In order to release the safety means and slide the cover 40 past the indentations 80, it is necessary to pivot the cover on the axis defined by opposing cover slots 60, so that the bottom end 48 of the cover is positioned at approximately a 45 degree angle relative to the side housing flanges 30. At this orientation, the dimension Y between cover side edges 62, 64 assumes a generally horizontal orientation relative to the housing side flanges 30 to define a maximum space for passage of the cover over the indentations 80 (see FIG. 7). An important safety feature of the invention is introduced by the requirement that the cover be pivoted a defined distance to permit its passage beyond the locking indentations 80, preventing inadvertent downward movement of the cover 40.

In typical applications of the lock box 10, the serviceman will release the cover lock 70 permitting the cover to move downwardly on the inwardly extending housing flanges 30 until the cover slots automatically engage the first pair of locking indentations 80. The serviceman must take deliberate action, outwardly pivot the cover 40, in order to cause the cover to continue to move downward. And, even if the serviceman releases the cover after its passage over the uppermost pair of indentations 80, a second lower pair of indentations is provided to control movement of the cover. This automatic locking feature overcomes hazards presented in prior art lock boxes in which the cover could dislodge from the box or otherwise, by reason of its weight, move to an open position without restraint causing injury.

When the cover 40 passes downwardly beyond the lower set of indentations 80, the inwardly extending top end cover flange 44 contacts the upwardly extending housing flange 38 to prevent dislodgement of the cover from the housing. In this open position, the cover 40 is positioned in locked engagement, as shown in FIG. 9, with the housing 20 providing full access to the interior chamber 34 of the lock box.

From the foregoing, it will be appreciated that the present invention provides a lock box 10, particularly useful for housing cable television distribution units which overcomes the difficulties of the prior art and which achieves the objects stated heretofore. In particular, there is disclosed a lock box having improved safety features in which the cover 40 may be readily positioned in secure open and closed positions for ready access to housed electrical components, including a safety locking mechanism which prevents downward movement of the cover 40 through inadvertence. Advantageously, the safety locking mechanism, including indentations 80, is of uncomplex design and coacts with a novel arrangement of slots 60 by the expedient of pivoting the cover. The cover safety indentations 80 provide further advantage in that the locking mechanism does not employ movable parts which can jam or otherwise malfunction.

Numerous modifications may be possible in light of the above teachings. For example, although the safety locking means, shown in the drawings, includes two pairs of indentations 80, it will be appreciated that a single indentation 80 in one of the housing side flanges 30 will also function to lock the cover against further downward movemet. In like manner, any number of pairs of indentations 80 may be employed to further control the downward movement of the cover 40. Similarly, although the lock box is shown as having a generally rectangular solid configuration, boxes of other configurations may be designed to incorporate the cover 40 and safety locking means of the present invention.

It is to be understood, therefore, that the above described embodiment of the invention is merely illustrative and that other embodiments may be devised by those skilled in the art, without departing from the spirit or scope of the present invention, as set forth in the appended claims.

I claim:

1. An enclosure for electrical components comprising:
   an open faced housing for receiving the electrical components, including inwardly extending and generally opposing side flange sections;
   a cover for closing the open housing face, including top, bottom, and side ends, the top end having an inwardly extending flange, each side end having a slot dimensioned for slidable and pivotal engagement with the side housing flange sections, such that the cover may be positioned in overlying relation with respect to the open face of the housing; and
   safety means for locking the cover at spaced positions on the side housing flanges, said safety means engaging automatically when the cover is oriented in a generally parallel relation to said side housing flanges and caused to move downward a spaced distance from a position overlying and enclosing the open housing face, said safety means disengaging when the cover is pivoted at said cover slots.

2. An enclosure for electrical components according to claim 1, wherein the slots are located in the top end of the cover in proximity to the top end cover flange and define a horizontal axis.

3. An enclosure for electrical components according to claim 2, wherein the slots have spaced apart side edges and a base edge.

4. An enclosure for electrical components according to claim 1, wherein said safety means comprises an indentation in one of the housing side flanges.

5. An enclosure for electrical components according to claim 3, wherein the safety means comprises an indentation in each of the housing side flanges, said indentations being positioned in a common horizontal plane, and having a depth greater than the horizontal, but less than the angular distance between the slot side edges.

6. An enclosure for electrical components according to claim 5, wherein said housing has a rectangular solid configuration, including bottom, top, rear and side walls, inwardly extending bottom and top flanges, and wherein said cover includes inwardly extending side and bottom flanges for encasing said side and bottom housing walls.

7. An enclosure for electrical components according to claim 6, wherein said top housing flange is spaced outwardly from said side housing flanges, such that said top end of the cover may be positioned in underlying relation with respect to the top housing flanges.

8. An enclosure for electrical components according to claim 7, wherein the cover includes a section of reduced width adjacent said slots.

9. An enclosure for electrical components according to claim 8, further comprising locking means for securing the cover in overlying relation to the open housing face.

10. An enclosure for electrical components according to claim 9, wherein said locking means includes a key actuated dead bolt.

11. An enclosure for electrical components comprising:
- an open-faced housing for receiving the electrical components, including inwardly extending and generally opposing side flange sections;
- a cover for closing the open housing face including top, bottom and side ends, the top end having an inwardly extending flange, and spaced slots for pivotal and slidable engagement of the cover to the open face of the housing, the slots being located in said opposing side ends along a common horizontal axis; and
- safety means for locking the cover at spaced positions with respect to the side housing flanges, said safety means engaging automatically when the cover is oriented in a generally parallel relation to said side housing flanges, and caused to move downward a spaced distance from a position overlying and enclosing the open housing face, said safety means disengaging when the cover is pivoted at said cover slots.

12. An enclosure for electrical components according to claim 11, wherein the slots have spaced apart side edges and a base edge, and wherein the safety mean comprises at least one pair of indentations, each pair including an indentation in each of the housing side flanges, each pair of indentations being aligned horizontally, and each indentation having a depth greater than the horizontal but less than the angular distance between the slot side edges.

* * * * *